(12) United States Patent
Chen et al.

(10) Patent No.: US 7,939,222 B2
(45) Date of Patent: May 10, 2011

(54) METHOD AND SYSTEM FOR IMPROVING PRINTING ACCURACY OF A CONTACT LAYOUT

(75) Inventors: Jhun-Hua Chen, Chang Hua (TW); Hua-Tai Lin, Hsin-Chu (TW); Lai Chien Wen, Hsin-Chu (TW); Fu-Jye Liang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 346 days.

(21) Appl. No.: 11/687,497

(22) Filed: Mar. 16, 2007

(65) Prior Publication Data

US 2008/0226996 A1 Sep. 18, 2008

(51) Int. Cl.
*G03F 1/00* (2006.01)
*H01L 21/00* (2006.01)
*G06F 17/50* (2006.01)

(52) U.S. Cl. .................. 430/5; 430/311; 716/53; 716/55
(58) Field of Classification Search ................ 430/5, 30; 716/19, 20, 21
See application file for complete search history.

(56) References Cited

U.S. PATENT DOCUMENTS

| | | | |
|---|---|---|---|
| 7,065,738 B1 * | 6/2006 | Kim ................................ 716/19 |
| 2003/0044721 A1 * | 3/2003 | Hotta et al. .................... 430/311 |
| 2005/0208392 A1 * | 9/2005 | Yamamoto ........................ 430/5 |

* cited by examiner

*Primary Examiner* — Stephen Rosasco
*Assistant Examiner* — Jonathan Jelsma
(74) *Attorney, Agent, or Firm* — Haynes and Boone, LLP

(57) ABSTRACT

A photolithography system for printing a pattern of at least one contact or via on a wafer is provided. The system comprises a reticle having a layout, the layout comprises at least one polygon-shaped hole, wherein the at least one polygon-shaped hole comprises at least eight sides.

10 Claims, 3 Drawing Sheets

METHOD AND SYSTEM FOR IMPROVING PRINTING ACCURACY OF A CONTACT LAYOUT

BACKGROUND

In semiconductor manufacturing technologies, a layout showing placement of contacts and vias received from a customers typically comprises square and rectangular shapes. During exposure, circular and irregular patterns, as opposed to square and rectangular patterns, are printed on the wafer. The circular and irregular patterns are caused by shape distortion that occurs during exposure regardless of the illuminating source. A problem exists with the circular patterns in that only a few target points are provided as a result for optical proximity correction. Fewer target points means less accuracy of the printed pattern compared to the original layout. Therefore, a need exists for a method and system that improves printing accuracy of contact or via layout by providing more target points.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
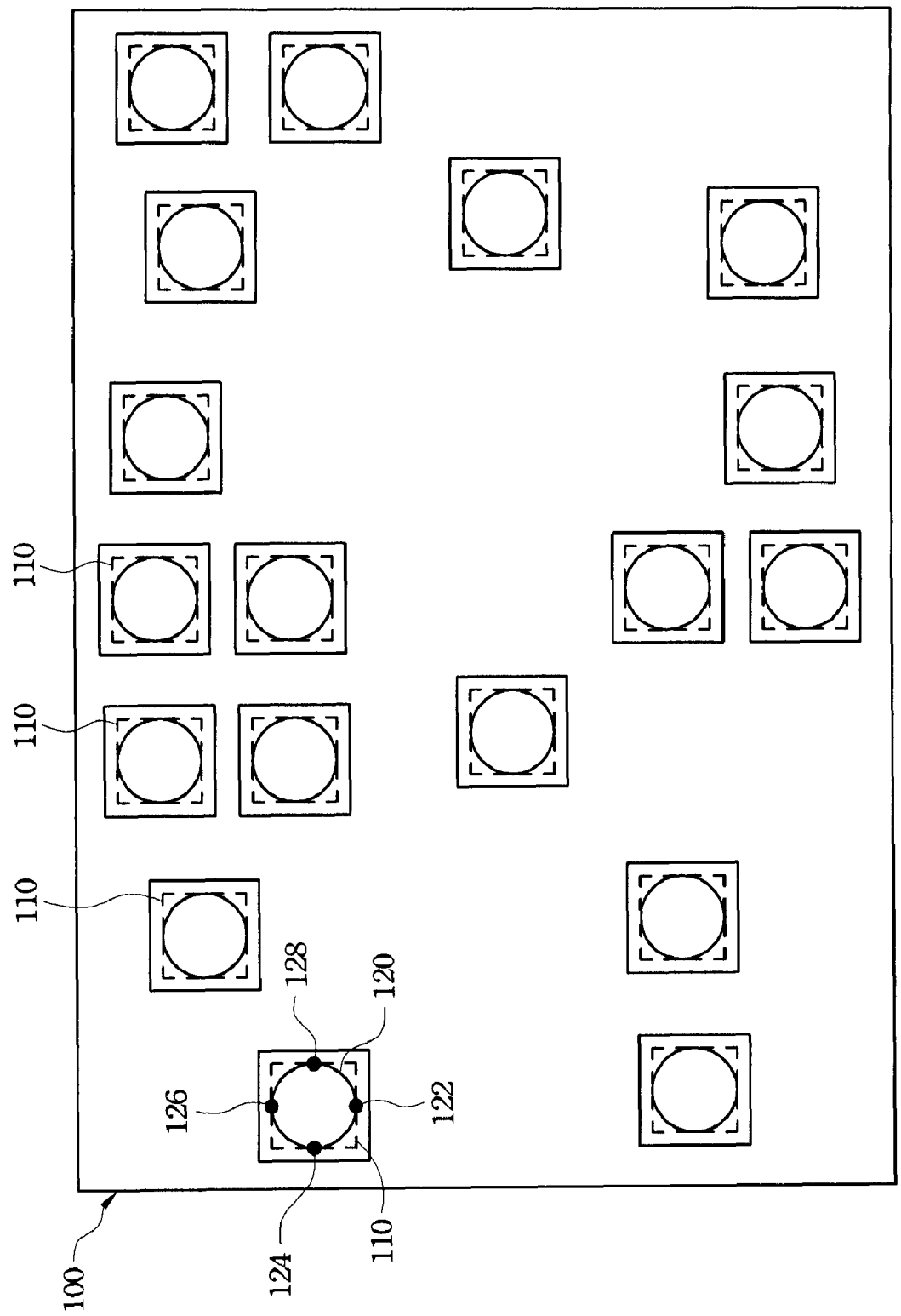
FIG. 1 is a diagram of exemplary contact or via layout comprising a plurality of square holes.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an exemplary layout 100 comprises a plurality of square or rectangular holes, such as holes 110, each represented by dashed lines. The plurality of square holes are provided by the customer. Each of the square holes, such as hole 110, represents a contact or via. When the layout 100 is transferred to a wafer by exposure during a photolithographic process, a circular pattern, such as circular pattern 120, is printed on the wafer for each of the rectangular holes. In this example, circular pattern 120 is represented by solid lines.

It is recognized that the shape of each circular pattern transferred to the wafer roughly corresponds to the shape of the corresponding rectangular hole 110. For example, a hole on which all four sides are equal will be transferred to the wafer as substantially circular pattern, whereas a hole having two sides longer than the other two sides will be transferred to the wafer as a substantially oval-shaped pattern.

Four target points 122, 124, 126, and 128 are generated in the circular pattern 120 using conventional optical proximity correction (OPC) tools. OPC is the introduction of selective image size alternations into the pattern in order to compensate for optical proximity effects caused by wafer exposure. A target point is a point where the exposed pattern, such as circular pattern 120, and the original layout, such as hole 110, intersects.

It is noted that the more target points an exposed pattern includes, the more accurate the exposed pattern is to the original layout. This is because the difference between the area of the original layout 110 and the area within the contour of the pattern 120 becomes smaller as the number of target points increases. A smaller difference means that the shape of the exposed pattern is closer to the shape of the original layout. OPC ensures that the contour of the profile, in this example, circular pattern 120, includes each of the target points.

Figure 2:
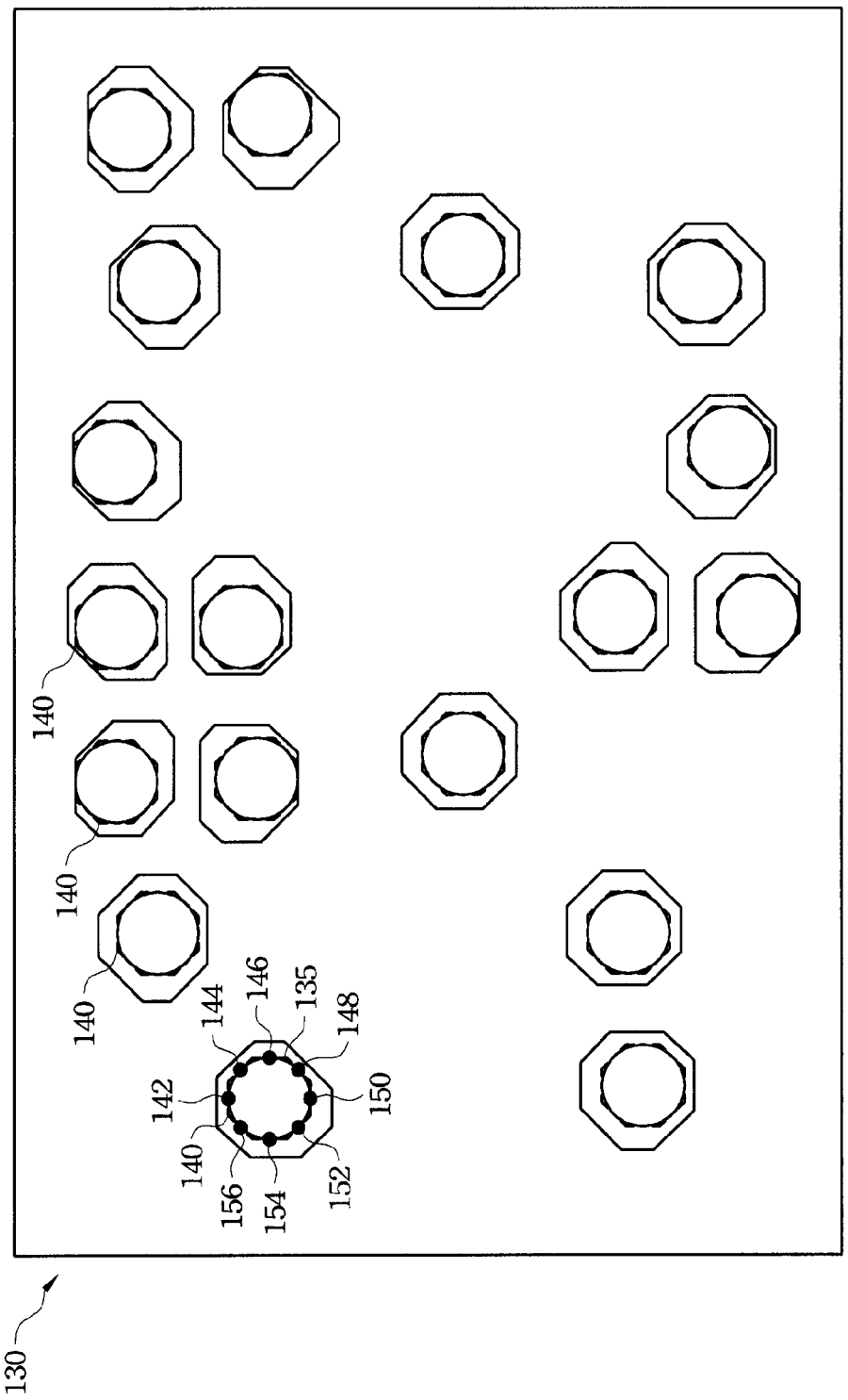
FIG. 2 is a diagram of exemplary contact or via layout comprising a plurality of polygon-shaped holes.

Referring to FIG. 2, aspects of the present disclosure provide a method and system for increasing the number of target points. Layout 130 comprises a plurality of polygon-shaped holes, such as hole 140, represented by dashed lines. Each of the plurality of polygon-shaped holes, such as hole 140, is octagonal. However, other polygon shapes comprising more than eight sides may also be used without departing the spirit and scope of the present disclosure. For example, the polygons 140 may be nonagons, decagons or other shapes.

When the layout 130 is exposed onto to a wafer, a circular pattern, such as circular pattern 135, is printed on the wafer for each of the polygon-shaped holes, such as hole 140. In this example, circular pattern 135 is represented by solid lines. Additional target points are generated in the circular pattern 135 based on the plurality of polygon-shaped holes, such as hole 140. In this example, eight target points 142, 144, 146, 148, 150, 152, 154, and 156 are generated. With eight instead of four target points, the difference between the area of the original layout 140 and area within the contour of the pattern 135 becomes smaller. Thus, the shape of the exposed pattern is closer to the shape of the original layout. As a result, shape distortion issues may be minimized.

Figure 3:
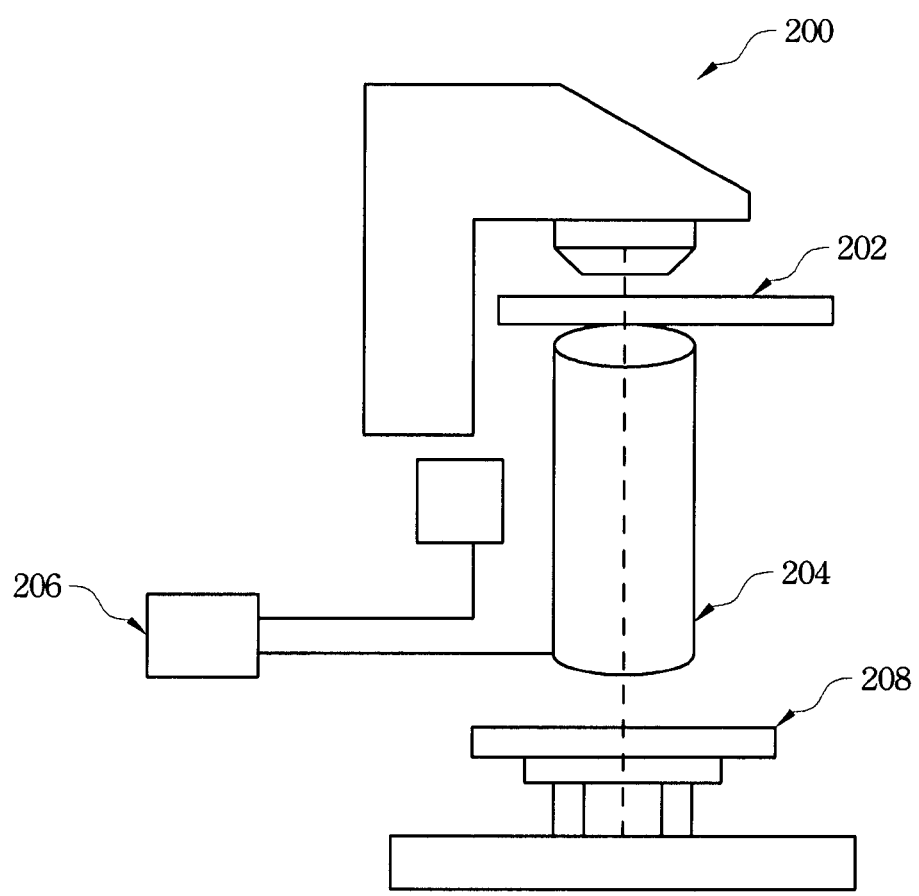
FIG. 3 is a diagram illustrating a system for improving printing accuracy of a contact layout in accordance with an embodiment of the present disclosure.

Referring to FIG. 3, a diagram illustrating a system for improving printing accuracy of a contact layout is depicted. Aspects of the present disclosure may be implemented within a photo alignment system 200, which in this example comprises a reticle 202, a projection lens 204, an alignment laser source 206, and a wafer stage 208. The polygon-shaped hole layout of the present disclosure may be implemented within the reticle 202, which is then projected onto a wafer during exposure.

Using the polygon-shaped hole layout, more target points are generated in the profile, which ensures that the shape of the profile is close to the shape of designer's original layout. In addition, influence from the layout environment and the illumination source that distort the shape of the profile may be reduced. Furthermore, the stability of the photo alignment system is increased, since obtaining critical dimension measurement is much easier with a profile such as circular pattern 135.

In summary, the present disclosure provides a method and a system for increasing printing accuracy of a layout of a contact or a via. In one embodiment, a photolithography system for printing a pattern of at least one contact or via on a wafer is provided. The system comprises a reticle having a layout, the layout comprises at least one polygon-shaped hole, wherein the at least one polygon-shaped hole comprises at least eight sides.

The at least one polygon-shaped hole may be an octagon, a nonagon, a decagon, or other shapes. A pattern is printed onto a wafer after exposure of the layout onto the wafer. The pattern comprises a plurality of target points. Each of the plurality of target points is an intersection of the pattern and the layout. The pattern comprises more than four target points. The accuracy of the pattern to the layout is increased based on an increase of the plurality of target points.

In another embodiment, a method for printing a pattern of at least one contact or via on a wafer is provided. In this method, a reticle is provided to a photolithography system, the reticle having a layout comprising at least one polygon-shaped hole, wherein the at least one polygon-shaped hole comprises at least eight sides. A pattern is printed onto a wafer using the reticle. The at least one polygon-shaped hole may be an octagon, a nonagon, a decagon, or other shapes. The pattern comprises a plurality of target points. Each of the plurality of target points is an intersection of the pattern and the layout. The pattern comprises more than four target points. The accuracy of the pattern to the layout is increased based on an increase of the plurality of target points.

In yet another embodiment, a system for printing a pattern of at least one contact or via on a wafer is provided. The system comprises a light source, a reticle comprising a layout having at least one polygon-shaped hole, wherein the at least one polygon-shaped hole comprises at least eight sides, and a projection lens for projecting the light source onto a wafer to print a pattern based on the layout of the reticle. The at least one polygon-shaped hole may be an octagon, a nonagon, a decagon, or other shapes. The pattern comprises a plurality of target points. Each of the plurality of target points is an intersection of the pattern and the layout. The pattern comprises more than four target points. The accuracy of the pattern to the layout is increased based on an increase of the plurality of target points.

Aspects of the present disclosure are best understood from the following above description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A photolithography system for printing a pattern of at least one contact or via on a wafer, the photolithography system comprising:
    a mechanism for providing a layout, the layout comprising at least one polygon-shaped hole, wherein the at least one polygon-shaped hole comprises at least eight sides;
    a projection lens adapted to transfer the layout, including the at least one polygon-shaped hole, to the wafer as an exposed pattern; and
    an optical proximity correction tool adapted to identify a plurality of points along a perimeter of the exposed pattern that intersect a perimeter of the at least one polygon-shaped hole, and to correct optical proximity effects to ensure the exposed pattern includes the plurality of points, wherein the plurality of points comprises at least eight target points.

2. The photolithography system of claim 1, wherein the at least one polygon-shaped hole is a nonagon.

3. The photolithography system of claim 1, wherein the at least one polygon-shaped hole is a decagon.

4. The photolithography system of claim 1, wherein accuracy of the exposure pattern to the layout is increased based on an increase in a number of the plurality of points.

5. A method for printing a pattern of at least one contact or via on a wafer, the method comprising:
    providing a reticle to a photolithography system, the reticle having a layout comprising a polygon-shaped hole, wherein the polygon-shaped hole comprises at least eight sides;
    transferring the polygon-shaped hole to the wafer as an exposed pattern;
    identifying a plurality of points along a perimeter of the exposed pattern that intersect a perimeter of the polygon-shaped hole using an optical proximity tool; and
    correcting optical proximity effects using the optical proximity correction tool to ensure the exposed pattern includes the plurality of points, wherein the plurality of points comprises at least eight target points.

6. The method of claim 5, wherein the polygon-shaped hole is an nonagon.

7. The method of claim 5, wherein accuracy of the exposed pattern to the layout is increased based on an increase in a number of the plurality of target points.

8. A method for printing a pattern of at least one contact or via on a wafer, the method comprising:
    receiving a layout having a first polygon-shaped hole having at least one of a rectangular shape and square shape;
    converting the first polygon-shaped hole to a second polygon-shaped hole having more than eight sides;
    forming an exposed pattern of the second polygon-shaped hole;
    identifying a plurality of points along a perimeter of the exposed pattern that intersect a perimeter of the second polygon-shaped hole using an optical proximity tool; and
    correcting optical proximity effects using the optical proximity correction tool to ensure the exposed pattern includes the plurality of points, wherein the plurality of points comprises more than eight target points.

9. The system of claim 8, wherein an accuracy of the exposed pattern to the layout is increased based on an increase in a number of the plurality of target points.

10. The method of claim 8, wherein the correcting optical proximity effects includes correcting the second polygon-shaped hole.

* * * * *